(12) United States Patent
Zortea et al.

(10) Patent No.: US 6,389,090 B2
(45) Date of Patent: *May 14, 2002

(54) DIGITAL CLOCK/DATA SIGNAL RECOVERY METHOD AND APPARATUS

(75) Inventors: Anthony E. Zortea, Pipersville; Kenneth Paist, Spring City, both of PA (US)

(73) Assignee: 3Com Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/019,949

(22) Filed: Feb. 6, 1998

(51) Int. Cl.[7] ................................................. H03D 3/24
(52) U.S. Cl. ........................ 375/374; 375/375; 375/376; 327/158; 327/159
(58) Field of Search ................................ 375/371, 373, 375/374, 375, 376, 294; 327/156, 158, 159

(56) References Cited

U.S. PATENT DOCUMENTS

| | | | | |
|---|---|---|---|---|
| 4,129,748 A | * | 12/1978 | Saylor | 178/69.1 |
| 5,173,617 A | * | 12/1992 | Alsup et al. | 307/269 |
| 5,297,173 A | * | 3/1994 | Hikmet et al. | 375/118 |
| 5,521,499 A | * | 5/1996 | Goldenberg et al. | 327/237 |
| 5,574,756 A | * | 11/1996 | Jeong | 375/376 |
| 5,646,519 A | * | 7/1997 | Hamilton et al. | 324/76.82 |
| 5,754,606 A | * | 5/1998 | Matsuyama et al. | 375/373 |
| 5,838,749 A | * | 11/1998 | Casper et al. | 375/376 |
| 5,889,828 A | * | 3/1999 | Miyashita et al. | 375/374 |
| 5,963,069 A | * | 10/1999 | Jefferson et al. | 327/158 |
| 5,999,027 A | * | 12/1999 | Yamazaki | 327/161 |

OTHER PUBLICATIONS

B. Kim et al., "A 30–Mhz Hybrid Analog/Digital Clock Recovery Circuit in 2–μm CMOS", IEEE Journal of Solid–State Circuits, vol. SC–25, pp. 1385–1394, Dec. 1990.

* cited by examiner

*Primary Examiner*—Stephen Chin
*Assistant Examiner*—Dac V. Ha
(74) *Attorney, Agent, or Firm*—Michaelson & Wallace; Peter L. Michaelson

(57) ABSTRACT

For a digital communications receiver, a clock and data signal recovery circuit and method use an all digital delay locked loop timed by an on-chip transmit clock signal. The digital delay locked loop includes a phase detector and loop filter. The phase detector determines, for each data signal rising or falling edge, if the current delay of a reference clock signal leads or lags the data signal edge. The loop filter examines the stream of such lead/lag indications, performs a nonlinear filtering process thereon, and in response increases or decreases the clock signal phase appropriately.

34 Claims, 4 Drawing Sheets

# DIGITAL CLOCK/DATA SIGNAL RECOVERY METHOD AND APPARATUS

BACKGROUND

1. Field of the Invention

This invention relates to digital communications and more specifically to clock and data signal recovery for digital communications.

2. Description of the Prior Art

As is well known in the field of digital (e.g., computer data) communications, two fundamental processes are carried out at the receiver end of a communications system to convert an analog signal transmitted along a communications channel to a digital signal. These processes are (1) analog amplitude domain processing which typically includes signal equalization and slicing in order to produce a discrete level, analog transition time signal; (2) analog transition time processing which typically includes clock signal and data signal recovery to produce a discrete level, discrete time signal; see "A 30-MHz Hybrid Analogy Digital Clock Recovery Circuit in 2-$\mu$mCMOS," Kim et al., *IEEE Journal of Solid-State Circuits*, SC-25, December 1990, PP. 1385–1394. This disclosure is directed to the latter process.

Note that a discrete level/analog transition time signal has only two voltage levels but can transition between those levels at any time. A discrete level/discrete time signal again has only two voltage levels but can transition between those two levels only at multiples of a time period.

Data recovery is usually achieved by sampling a discrete level/analog-transition-time signal at a rate determined by a recovered clock (timing) signal. There is typically no independent timing signal per se; instead the "clock signal" is inherent in the timing of the data signal pulses. The recovered clock signal therefore is a timing signal generated synchronous to the rate at which the original data pulses were transmitted from the receiver.

See FIG. 1 showing a conventional digital communications system including, at the receiver end, a D-type flip flop circuit 14, to the D terminal of which a data signal is coupled via line 10. The clock input terminal of flip flop 14 is connected via input line 16 to a transmitter (Tx) clock signal. The output signal from flip flop 14 at its Q terminal is coupled via analog processor 20 to a communications channel 22, for instance a twisted cable pair, coaxial cable etc. Channel 22 may also be for instance an optical fiber link, telephone line, microwave transmission system, etc. (In the optical fiber situation, the analog processor 20 is replaced by an optical transmitter.)

At the distal end of the communications channel 22 the receiver is located which includes an analog processing circuit 26, as described above including both equalization and slicer functions. The output signal from analog processing circuit 26 is connected to the input terminal of a clock recovery circuit 30, the output terminal of which is connected to the clock input terminal of a D type flip flop 32 which performs the data recovery function. Line 36 connects the output terminal of the analog processing circuit 26 to the D input terminal of the data recovery flip flop 32. The recovered data signal is output on the output (Q) terminal of the flip flop 32.

FIG. 2 relates to FIG. 1 by showing at each of the designated nodes A, B, C, D, E, F, G in FIG. 1, the associated waveform. Node A carries the digital clock signal; node B carries the digital data signal, each pulse of which defines a high and a low state. Node C carries the analog counterpart of the node B signal. Node D carries the received analog signal as distorted by channel 22. Node E carries the processed received analog signal, including some errors at the transition times (arrows). Node F carries the recovered clock signal and node G the recovered digital data signal.

FIG. 3 shows detail of the clock recovery circuit 30 of FIG. 1, illustrating one technique for clock/data recovery which recovers the clock signal using an analog phase-locked loop (PLL) that is locked to the discrete-level/analog-transition-time signal, hereinafter referred to as the analog-transition signal. This recovered clock signal is applied to a flip flop 32 to sample the analog-transition signal. The output of flip flop 32 at node G is the discrete level, discrete time signal hereinafter referred to as a digital signal.

The clock recovery circuit 30 includes a phase detector 40 which generates up or down pulses whose durations are proportional to the phase error between the recovered clock signal and the signal at node E. The output of the phase detector 40 is coupled to a charge pump 44 which in turn is connected via analog filters 46 and 48 to the input terminal of a voltage controlled oscillator (VCO) 54. The output signal from the VCO 54 is fed back to the other terminal of the conventional phase detector 40, thus forming the conventional analog phase locked loop. The nodes E, F, A in FIG. 3 correspond to the similar nodes in FIG. 1.

The analog PLL, while common, suffers the same disadvantages as most analog circuits, namely: being difficult to manufacture because of process variations, sensitive to system noise, and sensitive to temperature and power supply drift.

SUMMARY

In accordance with this invention, clock and data signal recovery is performed, in one embodiment, without using an analog PLL, and wherein all digital processing is performed at for instance one half the data rate. This is done by providing a digital delay locked loop based on e.g., an off chip reference clock signal. A phase detector, phase pump, and a loop filter are in the delay locked loop, where the phase detector determines for each data pulse's rising (or falling) edge, if the current delay (phase) of the reference clock signal is leading or lagging the data signal edge. The loop filter determines from the stream of lead/lag indicators, by a non-linear digital filtering process, whether it should increase or decrease the delay. The phase pump "holds," or stores the current reference clock signal phase, until the next update by the loop filter. This advantageously eliminates the VCO from the loop, allows use of digital signal processing, and provides better performance.

In one embodiment the non-linear loop filter is a digital signal processing apparatus and drives a phase pump which in turn outputs a signal to a selector which selects from amongst a number (e.g. 32) of various phases of a clock signal. The phase is selected in response to whether a lead or lag adjustment is necessary. This leading or lagging new clock signal is then fed back to the phase detector and also is used as the clock signal to clock the data recovery circuit.

DETAILED DESCRIPTION

Figure 4:
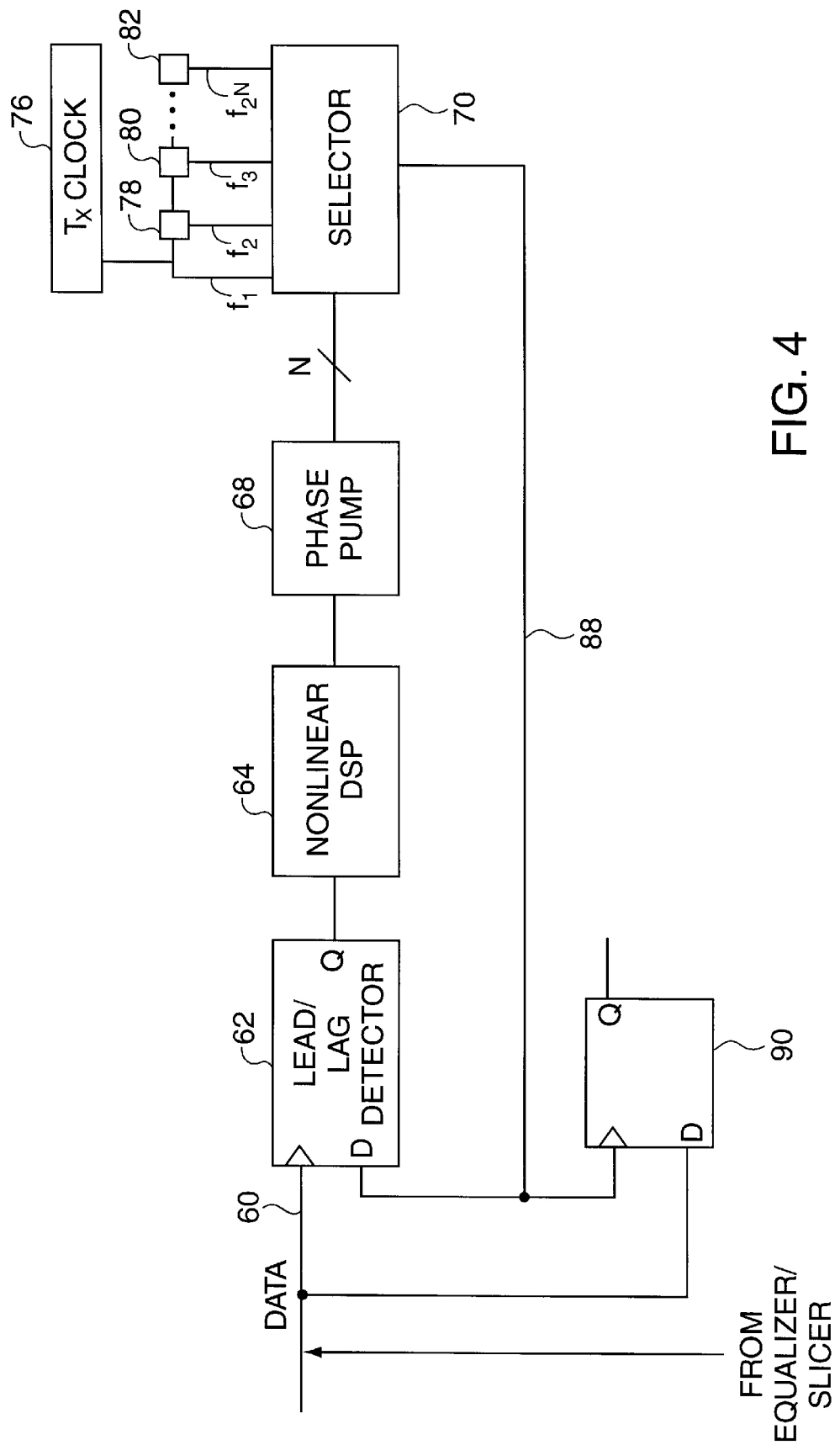
FIG. 4 shows a clock and data recovery circuit in accordance with this invention.

FIG. 4 shows relevant portions of a receiver for a digital communication system in accordance with this invention. Other conventional portions of the receiver are not shown. For instance, where this receiver is used in a Fast Ethernet environment, the conventional higher layers of circuitry that interface to e.g. a computer that uses the received data signal are not shown. The receiver in FIG. 4 is intended to replace elements 30 and 32 in a system as in FIG. 1 and hence only represents the analog transition time processing portion, i.e., the clock and data recovery portion of the receiver.

Figure 1:
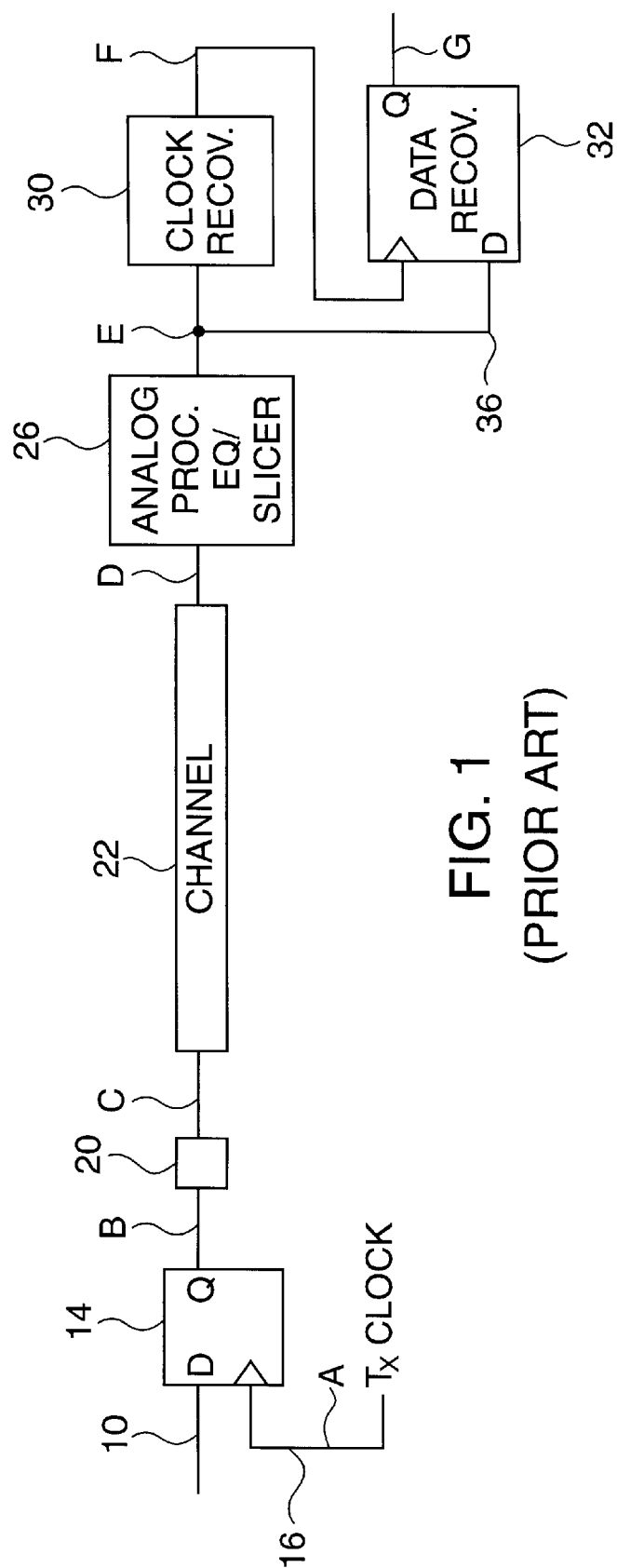
FIG. 1 shows a prior art phase detector.
Figure 2:
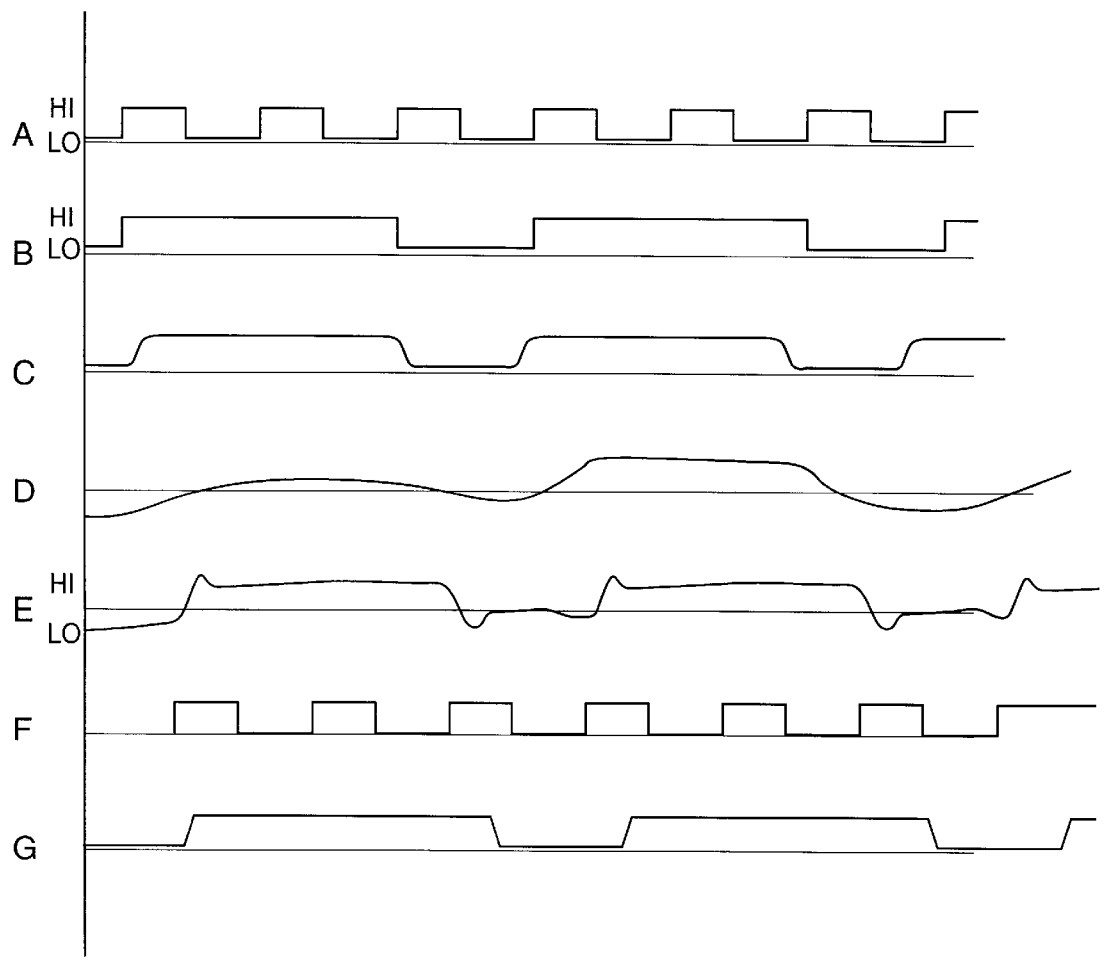
FIG. 2 shows waveforms associated with various nodes of the circuit of FIG. 1.
Figure 3:
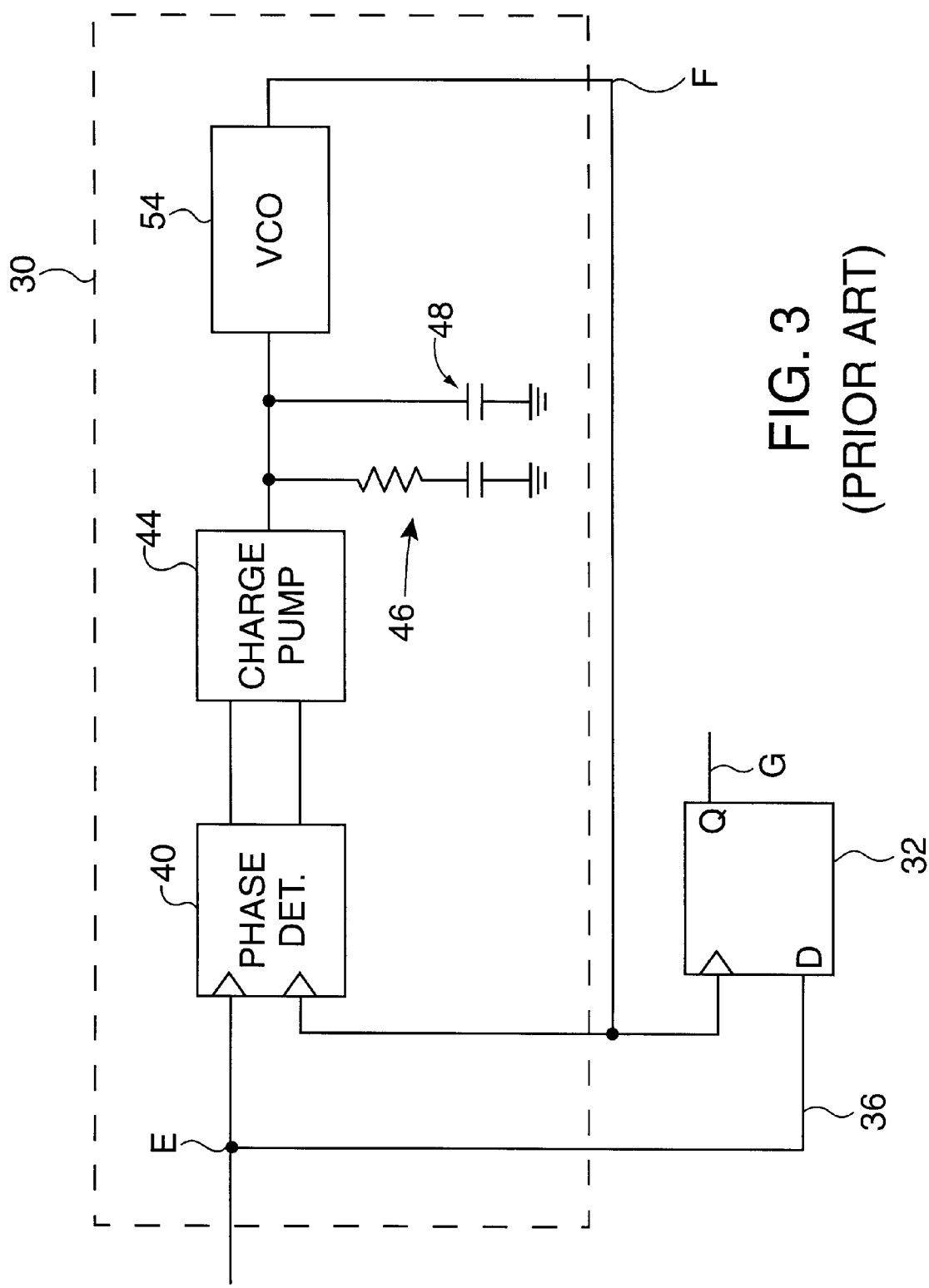
FIG. 3 shows the clock and data recovery circuits of FIG. 1 in additional detail.

In FIG. 4, as in FIG. 1, line 60 is coupled to the output terminal of an equalizer/slicer circuit 26, which may be conventional.

The incoming data signal on line 60 is therefore coupled to one (clock) input terminal of a lead/lag detector 62, the other input terminal of which is coupled to the output terminal 88 of multiplexer 70 and to the clock terminal of the data recovery flip flop 90. Lead/lag detector 62 is e.g. a D type flip flop connected as shown. In this case the clock input terminal is connected to receive the "data" input while the D input terminal is connected to receive the "clock" input signal, so this flip flop 62 is connected in the reverse to the usual flip flop connections. This is because the data signal is being used to sample the clock signal to determine if it (the clock) is currently leading or lagging. The output (Q) terminal of the detector 62 is connected to the input terminal of a non-linear digital signal processing element 64 which is part of the loop filter referred to above, further functionality of which is explained below.

The output terminal of the non-linear DSP element 64 is connected to the input terminal of a phase pump 68. The phase pump 68 is a digital circuit that essentially increases or decreases its output signal (according to its input signal) and holds its output signal. In this case the phase pump input signal is the amount of lead or lag as determined by 64 elements and its output goes to selector 70. So as long as the output signal of element 64 is zero, the output signal of phase pump 68 will be held e.g. for 32 data edges.

The output port of phase pump 68 is an N bit digital bus coupled to the N control terminals of a selector (multiplexer) 70. The various signal input terminals of multiplexer 70 are coupled to receive various clock signals $f_1, f_2, f_3, f_{2^N}$. In one example N equals 5, and so there are 32 such clock signals. The frequency of each clock signal $f_1, f_2$ etc. is the same: however they are each slightly out of phase with one another, i.e. each is a successively delayed version of the clock signal. In one embodiment these clock signals are generated by applying a single clock signal from source 76 to the input terminal of a set of serially connected delay elements 78, 80, . . . 82. Hence in this case there are 31 such delay elements providing 32 signals $f_1, f_2, \ldots f_{32}$. The delay provided by each delay element is equivalent to that of $\frac{1}{2}^N$ times the minimum expected time between successive data signal edges (data signal period). Hence in one example if the period between successive data signal edges is no less than 8 nanoseconds and there are 31 delay elements, each delay element gives 0.25 nanoseconds of delay.

The source 76 of the clock signals in FIG. 4 is here designated as being a transmission (Tx) clock, because in one embodiment the source 76 is an on-chip "transmission clock" signal which is part of a transmitter. (It is to be understood that the FIG. 4 circuit, while it is a receiver, in this embodiment is on the same integrated circuit with an associated transmitter which has its own clock signal source.) Generally such an "on-chip" transmission clock signal is known to be within a very small tolerance, in terms of frequency, of the received signal's clock signal. Hence this is a convenient source of a clock signal which is close to that of the received clock signal which is to be recovered. Of course, other sources for the reference clock signal(s) may be used instead.

Hence the output signal from the selector (multiplexer) 70 is the selected clock signal which is used to clock the data recovery circuit 90, which is similar to the data recovery circuit 32 in FIG. 1, and also used as a second input signal to the lead/lag detector 62. Hence the elements 62, 64, 68, 70 with feedback line 88 form a digital delay locked loop. Note that only one phase of the reference clock 76 is needed at any given time.

It is to be appreciated that in one embodiment this is essentially a digital device embodied in digital logic circuitry rather than by analog elements. As seen, no conventional analog filtering components are needed. Instead, filtering is provided by the non-linear digital signal processing element 64. In one embodiment this is an all digital device, i.e. having no resistors or capacitors. Hence the present digital delay locked loop is all digital.

The non-linear digital signal processing element 64 in one embodiment is all digital "hardware" (logic circuitry). However this is not limiting and in other embodiments this and other elements in accordance with this invention may be for instance in the form of code (software) to be executed by a general purpose processor or by a dedicated digital signal processor.

The non-linear digital signal processing element 64 determines if the previously chosen clock signal, supplied on the D terminal of lead/lag detector 62 is arriving, in terms of time, before (leading) or after (lagging) the data edge provided on line 60. Element 64 in one embodiment counts a consecutive number of such lead/lag comparisons, e.g. 16. Clearly if the last 16 comparisons include a preponderance of data pulse edges leading the clock signal, it is desirable to advance the clock signal; if the data edges are lagging the clock signal, it is desirable to retard the clock signal. Hence in the code POS-CNT (positive count) refers to the number of data pulse rising edges counted. One embodiment counts both the rising and falling edge of each data pulse. One accumulates e.g. 16 such counts. In one embodiment if more than half these 16 counts indicate the existence of a lead, then one wants to delay the clock signal; if less than half of them indicate a lead, one wants to advance the clock signal. In one embodiment the advance at each instance is only one increment, where the increment is the difference between for instance signals $f_1$ and $f_2$ or $f_2$ and $f_3$ etc. Hence in this relatively simple version the advance (or retardation) at each decision time, e.g. 16 data edges, is only one phase (one delay period 78, 80, 82, etc.). In another version, the amount of delay or advance is made variable by using a more sophisticated non-linear DSP process in element 64.

Hence the output signal from the non-linear DSP element 64 is in one embodiment merely a 0 or 1, where 1 indicates advancing the clock phase by one delay and 0 indicates retarding the clock phase by one delay. The phase pump 68 then translates this value into the desired selection from amongst $f_1, f_2, f_3$, etc. since the phase pump 68 keeps track of the previously selected clock signal $f_1, f_2$, etc.

Hence by use of such an apparatus and the accompanying method, one dynamically alters the phase of the recovered clock signal using the all-digital delay locked loop.

This disclosure includes copyrightable material. The copyright owner gives permission for facsimile reproduction of material in Patent Office files but reserves all other copyright rights whatsoever.

This disclosure is illustrative and not limiting; further modifications will be apparent to one skilled in the art in the light of this disclosure and are intended to fall within the scope of the appended claims.

We claim:

1. A clock signal recovery apparatus for use in a receiver in a digital communications system, the clock signal recovery apparatus comprising:

a lead/lag detector having two input terminals and an output terminal, a first input terminal being coupled to receive an incoming data signal;

a signal processor having an input terminal coupled to receive an output signal from the lead/lag detector, and an output terminal carrying a signal indicating a lead or lag in a recovered clock signal;

a selector having a plurality of input terminals respectively coupled to receive clock signals of the same frequency and having differing relative delays, a control terminal coupled to the output terminal of the signal processor, and an output terminal carrying the recovered clock signal, the recovered clock signal being coupled to the second input terminal of the lead/lag detector;

the lead/lag detector being constructed to provide at the output of the lead/lag detector a sample of the recovered clock signal from the second input terminal of the lead/lag detector in response to at least one of a rising or falling edge of a data transition at the first input of the lead/lag detector;

wherein the clock recovery apparatus is constructed so as to be capable of recovering a transmit clock signal from non-periodic data within the incoming data signal;

a local oscillator having a fixed frequency at substantially a same frequency as the transmit clock signal of the non-periodic data;

a phase delay circuit coupled between the local oscillator and the selector, the phase delay circuit being capable of providing delayed clock signals of substantially the same frequency from a single frequency of the local oscillator; and wherein the signal processor comprises a phase pump portion connected to an output terminal of a non-linear digital signal processing portion, the phase pump portion being capable of providing a latched N-bit output signal in response to signals at the output terminal of the signal processing portion.

2. The apparatus of claim 1, wherein the lead/lag detector is a D type flip-flop, and its clock input terminal is the first input terminal and its D input terminal is the second input terminal.

3. The apparatus of claim 2, wherein a frequency of the clock signals coupled to the selector is approximately the same as that of the recovered clock signal.

4. The apparatus of claim 1, wherein a frequency of the clock signals is f, there are n input terminals of the selector, and a delay difference between clock signals is 1/nf.

5. The apparatus of claim 1, wherein the phase pump portion outputs an output signal indicating a phase change from the signal processor portion for a particular time period.

6. The apparatus of claim 1, wherein the signal processor portion accumulates a plurality of lead or lag indicating signals from the lead/lag detector and determines if the accumulated plurality of the signals collectively leads or lags the recovered clock signal and thereby outputs the signal indicating the lead or lag in the recovered clock signal.

7. The apparatus of claim 6, wherein the signal processor portion determines non-linearly if the accumulated plurality of output signals collectively lead or lag.

8. The apparatus of claim 7, whereupon if the accumulated plurality of signals are determined to be lagging, the signal processor portion outputs a signal for selecting a clock signal having reduced delay, and if the accumulated plurality of signals are determined to be leading, the signal processor portion outputs a signal for selecting a clock signal having an increased delay.

9. The apparatus of claim 1 wherein the apparatus includes only digital logic elements.

10. The apparatus of claim 1, wherein the lead/lag detector detects both rising and falling edges of incoming signal pulses.

11. A method for recovering a clock signal from a data portion of a received signal, comprising:

detecting a phase of the data portion of the received signal;

accumulating a plurality of the detected phases to determine a change in a recovered clock signal;

selecting one of a plurality of clock signals to be the recovered clock signal, each of the plurality of clock signals having about the same frequency and differing delays, in response to the determined change;

using the selected clock signal for detecting the phase of the data portion of the received signal by sampling the selected clock signal in response to at least one of a rising or falling edge of a data transition and supplying the sample as the detected phase;

wherein recovering the clock signal comprises recovering a transmit clock signal from a non-periodic incoming data signal;

providing from a local oscillator a fixed frequency at substantially a same frequency as the transmit clock signal of the non-periodic data signal;

providing delayed clock signals of substantially the same frequency from a single frequency of the local oscillator and;

wherein accumulating and selecting comprises using a phase pump portion connected to the output terminal of a non-linear digital signal processor, the phase pump portion being capable of providing a latched N-bit output signal in response to signals at the output terminal of the digital signal processor.

12. The method of claim 11, wherein the step of accumulating includes determining non-linearly if the accumulated detected phases collectively lag or lead the selected clock signal.

13. The method of claim 11, wherein the step of detecting includes detecting a phase of both positive going and negative going edges of the received signal.

14. The method of claim 11, wherein the step of accumulating includes counting a number of the detected signal edges that lag and a number of the detected signal edges that lead.

15. The method of claim 11, wherein the plurality of clock signals has frequency f, there are n clock signals in the plurality, and a delay difference between clock signals is 1/nf.

16. A receiver apparatus for receiving clock and data signals in a digital communications system comprising:

an equalizing and slicing portion which receives an incoming data signal and outputs a discrete level analog transition time signal;

a clock recovery portion including:
- a lead/lag detector having two input terminals and an output terminal, a first input terminal being coupled to receive the discrete level analog transition time signal;
- a signal processor having an input terminal coupled to receive an output signal from the phase detector, and an output terminal carrying a signal indicating the amount of lead or lag in the recovered clock signal;
- a selector having a plurality of input terminal respectively coupled to receive clock signals having about the same frequency and having different relative delays, a control terminal coupled to the output terminal of the signal processor, and an output terminal carrying the recovered clock signal, the recovered clock signal being coupled to the second input terminal of the lead/lag detector;
- the lead/lag detector being constructed to provide at the output of the lead/lag detector a sample of the recovered clock signal from the second input terminal of the lead/lag detector in response to at least one of a rising or falling edge of a data transition at the first input of the lead/lag detector;
- wherein the clock recovery portion is constructed so as to be capable of recovering a transmit clock signal from a non-periodic incoming data signal;
- a local oscillator having a fixed frequency at substantially a same frequency as the transmit clock signal of the non-periodic data signal;
- a phase delay circuit coupled between the local oscillator and the selector, the phase delay circuit being capable of providing delayed clock signals of the substantially the same frequency from a single frequency of the local oscillator; and
- wherein the signal processor comprises a phase pump portion connected to an output terminal of a non-linear digital signal processing portion, the phase pump portion being capable of providing a latched N-bit output signal in response to signals at the output terminal of the signal processing portion; and
- a data recovery portion having a clock terminal coupled to receive the recovered clock signal, a data input terminal coupled to receive the incoming data signal, and an output terminal providing a recovered data signal.

17. The apparatus of claim 16, wherein the data recovery portion is a D type flip-flop circuit.

18. The apparatus of claim 16, wherein the lead/lag detector is a D type flip-flop circuit and its clock input terminal is the first input terminal and its D input terminal is the second input terminal.

19. The apparatus of claim 18, wherein a frequency of the clock signals coupled to the selector is approximately the same as that of the recovered clock signal.

20. The apparatus of claim 16, wherein a frequency of the clock signals is f, and there are n input terminals of the selector, and a delay difference between clock signal is 1/nf.

21. The apparatus of claim 16, wherein the phase pump portion outputs an output signal indicating a phase change from the signal processor portion for a particular time period.

22. The apparatus of claim 21, wherein the signal processor portion accumulates a plurality of lead or lag indicating signals from the lead/lag detector and determines if the accumulated plurality of the signals collectively leads or lags the recovered clock signal, and thereby outputs the signal indicating the lead or lag in the recovered clock signal.

23. The apparatus of claim 22, wherein the signal processor portion determines non-linearly if the accumulated plurality of output signals collectively lead or lag.

24. The apparatus of claim 23, whereupon if the accumulated plurality of signals are determined to be lagging, the signal processor portion outputs a signal for selecting a clock signal having reduced delay, and if the accumulated plurality of signals are determined to be leading, the signal processor portion outputs a signal for selecting a clock signal having an increased delay.

25. The apparatus of claim 16 wherein the apparatus includes only digital logic elements.

26. The apparatus of claim 16, wherein the lead/lag detector detects both rising and falling edges of the incoming signal pulses.

27. A clock signal recovery apparatus for use in a receiver in a digital communications system, the clock signal recovery apparatus comprising:
- a) a lead/lag detector comprising first and second input terminals and an output terminal, the first input terminal being adapted to receive a data signal having an embedded clock;
- b) a signal processor comprising an input terminal coupled to the output terminal of the lead/lag detector, the signal processor being capable of providing a control signal at the signal processor output terminal responsive to signals at the output terminal of the lead/lag detector;
- c) a selector having a plurality of input terminals adapted to receive a plurality of phase delayed clock signals, the selector comprising a control terminal coupled to the output terminal of the signal processor, the selector being capable of providing the recovered clock signal at an output terminal in response to the control signal, the output terminal of the selector being coupled to the second input terminal of the lead/lag detector;
- d) the lead/lag detector being constructed to compare at least one of a rising or falling edge of a data transition of the data signal with the reconstructed clock signal and to supply a fixed pulse width output at the output terminal of the lead/lad detector indicating a relative leading or lagging position of edge transitions of the reconstructed clock and the embedded clock, and wherein a leading or lagging indication is supplied only when the at least one of a rising or falling edge is detected at the first input of the lead/lag detector such that the embedded clock signal may be recovered without utilizing a reference clock signal;
- e) wherein the clock recovery apparatus is constructed so as to be capable of recovering the clock signal to be recovered from non-periodic data within the incoming signal;
- f) a local oscillator having a fixed frequency at substantially a same frequency as the clock signal to be recovered;
- g) a phase delay circuit coupled between the local oscillator and the selector, the phase delay circuit being capable of providing delayed clock signals of substantially the same frequency from a single frequency of the local oscillator; and
- h) wherein the signal processor comprises a phase pump portion connected to an output terminal of a non-linear digital signal processing portion, the phase pump portion being capable of providing a latched N-bit output signal in response to signals at the output terminal of the signal processing portion.

28. The apparatus of claim 27 wherein the lead/lag detector is a single D type flip-flop having a clock input, a D input, and an output, and wherein the first input terminal of the lead/lag detector is the clock input of the D flip-flop, and wherein the second input terminal of the lead/lag detector is the D input of the D flip-flop.

29. The apparatus of claim 28 further comprising a phase delay apparatus adapted to receive a single clock signal having approximately a same frequency as the recovered clock signal and being capable of generating phase delayed clock signals therefrom, and wherein the phase delay apparatus is capable of generating phase delayed clock signals each having the same frequency f, and wherein the selector comprises n input terminals, and wherein the delay difference between each of the plurality of phase delayed signals is 1/nf.

30. The apparatus of claim 28 wherein the digital signal processor is capable of accumulating a plurality output signals from the lead/lag detector and providing an output based on the accumulated output signals.

31. The apparatus of claim 30 wherein the digital signal processor is a non-linear digital signal processor.

32. The apparatus of claim 31 wherein the lead/lag detector is capable of providing, at the output terminal of the lead/lag detector, a sample derived from the recovered clock signal present at the second input terminal of the lead/lag detector, in response to one of leading or lagging edges of the data signal.

33. A clock signal recovery apparatus for use in a receiver in a digital communications system the clock signal recovery apparatus comprising:

a phase detector having two input terminals and an output terminal, a first input terminal being coupled to receive an incoming signal having a clock signal to be recovered;

a signal processor having an input terminal coupled to receive an output signal from the phase detector, and an output terminal carrying a signal indicating a lead or lag in a the recovered clock signal;

a selector having a plurality of input terminals respectively coupled to receive clock signals of the same frequency and having differing relative delays, a control terminal coupled to the output terminal of the signal processor, and an output terminal carrying the recovered clock signal, the recovered clock signal being coupled to the second input terminal of the phase detector;

wherein the phase detector is a D type flip-flop having a clock input terminal as the first input terminal and a D input as the second input terminal;

wherein the clock recovery apparatus is constructed so as to be capable of recovering the clock signal to be recovered from non-periodic data within the incoming signal;

a local oscillator having a fixed frequency at substantially a same frequency as the clock signal to be recovered;

a phase delay circuit coupled between the local oscillator and the selector, the phase delay circuit being capable of providing delayed clock signals of substantially the same frequency from a single frequency of the local oscillator; and wherein the signal processor comprises a phase pump portion connected to an output terminal of a non-linear digital signal processing portion, the phase pump portion being capable of providing a latched N-bit output signal in response to signals at the output terminal of the signal processing portion.

34. A clock signal recovery apparatus for use in a receiver of a digital transmit/receive circuit, the clock signal recovery apparatus comprising:

a D-flip flop having a clock input terminal adapted to receive an incoming data signal;

a non-linear digital signal processor having an input terminal coupled to receive an output signal from the D-flip flop, the non-linear digital signal processor being capable of outputting at an output terminal;

a phase pump connected to the output terminal of the non-linear digital signal processor, the phase pump being capable of providing a latched N-bit output signal in response to the output terminal of the signal processor;

a selector having a plurality of input terminals respectively coupled to receive clock signals of the same frequency and having differing relative delays, a control terminal coupled to the output terminal of the signal processor, and an output terminal carrying the recovered clock signal, the recovered clock signal being coupled to the second input terminal of the lead/lag detector;

a lead/lag detector being constructed to provide at the output of the lead/lag detector a sample of the recovered clock signal from the second input terminal of the lead/lag detector in response to at least one of a rising or falling edge of a data transition at the first input of the lead/lag detector, the lead/lag detector comprising the D-flip flop;

wherein the clock recovery apparatus is constructed so as to be capable of recovering the clock signal from non-periodic data within the incoming data signal;

a local transmitter oscillator having a fixed frequency at substantially a same frequency as a transmit clock signal of the non-periodic data signal; and a phase delay circuit coupled between the local transmitter oscillator and the selector, the phase delay circuit being capable of providing delayed clock signals of substantially the same frequency from a single frequency of the local transmitter oscillator.

* * * * *